United States Patent
Chan et al.

(10) Patent No.: US 6,764,917 B1
(45) Date of Patent: Jul. 20, 2004

(54) SOI DEVICE WITH DIFFERENT SILICON THICKNESSES

(75) Inventors: Darin A. Chan, Campbell, CA (US);
William G. En, Milpitas, CA (US);
John G. Pellerin, Austin, TX (US);
Mark W. Michael, Cedar Park, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/023,350

(22) Filed: Dec. 20, 2001

(51) Int. Cl.$^7$ ................................................. H01L 21/76
(52) U.S. Cl. ........................ 438/406; 438/149; 438/311; 438/516
(58) Field of Search ................................. 438/149, 311, 438/406, 516, 227, 231, 416, 664; 257/79, 347, 368, 501, 350

(56) References Cited

U.S. PATENT DOCUMENTS

| | | | | |
|---|---|---|---|---|
| 4,642,878 A | * | 2/1987 | Maeda | ........................ 438/227 |
| 5,463,238 A | | 10/1995 | Takahashi et al. | |
| 5,627,399 A | * | 5/1997 | Fujii | ........................... 257/501 |
| 5,909,400 A | * | 6/1999 | Bertin et al. | ................. 365/187 |
| 5,940,691 A | | 8/1999 | Manning | |
| 6,060,748 A | * | 5/2000 | Uchida et al. | ............... 257/347 |
| 6,110,765 A | | 8/2000 | Manning | |
| 6,180,986 B1 | * | 1/2001 | Ishida | ......................... 257/368 |
| 6,537,891 B1 | * | 3/2003 | Dennison et al. | ........... 438/406 |
| 2001/0045561 A1 | * | 11/2001 | Hata et al. | ...................... 257/79 |

FOREIGN PATENT DOCUMENTS

JP         11 176925 A         7/1999

OTHER PUBLICATIONS

International PCT Search Report dated Apr. 10, 2003. received in corresponding PCT Cast PCT US/02/41102.

* cited by examiner

*Primary Examiner*—David Nelms
*Assistant Examiner*—Dao H. Nguyen

(57) ABSTRACT

A method of manufacturing a semiconductor device includes providing a silicon semiconductor layer over an insulating layer, and partially removing a first portion of the silicon layer. The silicon layer includes the first portion and a second portion, and a thickness of the second portion is greater than a thickness of the first portion. Initially, the first and second portions of the silicon layer initially can have the same thickness. A semiconductor device is also disclosed.

15 Claims, 6 Drawing Sheets

SOI DEVICE WITH DIFFERENT SILICON THICKNESSES

FIELD OF THE INVENTION

The present invention relates to the manufacturing of semiconductor devices, and more particularly, to forming silicon on insulator devices having improved characteristics.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS device includes a bulk semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS device is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

As an alternative to forming a MOS device on a bulk semiconductor substrate, the semiconductor layer can be formed on an insulating substrate, or over an insulation layer formed in a semiconductor substrate. This technology is referred to as Silicon-on-Insulator (SOI) technology. Silicon on insulator materials offer potential advantages over bulk materials for the fabrication of high performance integrated circuits. For example dielectric isolation and reduction of parasitic capacitance improve circuit performance. Compared to bulk circuits, SOI is more resistant to radiation. For example, silicon-on-sapphire (SOS) (SOS) technology has been successfully used for years to fabricate radiation-hardened complimentary MOS (CMOS) circuits for military applications. Circuit layout in SOI can also be greatly simplified and packing density greatly increased if the devices are made without body contacts in which the body regions of these devices are "floating".

A disadvantage of many SOI devices is the lack of a bulk silicon or body contact to the MOS transistor. If the channel/body region is left "floating", various hysteresis effects can prevent proper circuit operation. These effects include the so-called "kink" effect and the parasitic lateral bipolar action. Partially-depleted devices are such that the maximum depletion width in the body is smaller than the thickness of the semiconductor Si layer, and a quasi-neutral region results which has a floating potential. These floating body effects may result in undesirable performance in SOI devices.

MOS devices using SOI structure typically fall in one of two groups depending on the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

One consideration when manufacturing NMOS and PMOS SOI transistors is maintaining a proper channel length. The channel length can be shortened, for example, if the source/drain regions are exposed to excessive temperature and/or time during activation. This causes excess lateral diffusion of the dopants, which causes the channel length to shorten. NMOS and PMOS transistors are formed on a single chip and are therefore exposed to the same temperature/time profile during dopant activation. However, because the NMOS and PMOS transistors are formed using different dopants, which likely have different diffusion characteristics, the temperature/time profile for at least one of the NMOS or PMOS transistors will not be optimized.

Another consideration when forming transistors on a SOI structure is the formation of both fully depleted and partially depleted transistors. In a fully depleted transistor, the source/drain regions extend all the way through the silicon layer to the insulator, and in a partially depleted transistor, the source/drain regions extend partially through the silicon layer. One difference between a partially depleted transistor and fully depleted transistor is that the threshold voltage to obtain a drive or on current through a fully depleted transistor is lower than the threshold voltage for a partially depleted transistor. Accordingly, a need exists for an improved method of forming devices on an SOI structure that allows for improved performance, minimization of floating body effects, and allows for separate optimization of separate transistors formed on the SOI structure.

SUMMARY OF THE INVENTION

This and other needs are met by embodiments of the present invention which provide a method of manufacturing a semiconductor device that improves performance, minimizes floating body effects, and allows for separate optimization of separate transistors formed on an SOI structure. The method includes providing a silicon semiconductor layer over an insulating layer, and partially removing a first portion of the silicon layer. The silicon layer includes the first portion and a second portion, and a thickness of the second portion is greater than a thickness of the first portion. Initially, the first and second portions of the silicon layer can initially have the same thickness.

In another aspect of the invention, the first portion of the silicon layer is partially removed by etching. The partial removal of the first portion of the silicon layer can also include depositing a resist over the silicon layer and exposing and developing the resist to expose the first portion of the silicon layer. The thickness of the first portion is determined by etching the first portion for a predetermined length of time.

In still another aspect of the invention, the first portion of the silicon layer is partially removed by oxidizing the first portion of the silicon layer and removing the oxidized silicon. The partial removal of the first portion of the silicon layer can also include depositing a mask layer and a resist over the silicon layer and exposing and developing the resist to expose a portion of the mask layer over the first portion of the silicon layer and removing the mask layer over the first portion of the silicon layer. After partially removing the first portion, the mask layer can then be removed.

Isolating features can be formed before or after the first portion of the silicon layer is partially removed. Also, a first transistor can be formed in the first portion and a second transistor can be formed in the second portion. The first transistor can be a fully depleted transistor, and the second transistor can be a partially depleted transistor. Also, the first transistor can include source/drain regions formed with a first dopant and the second transistor can include source/drain regions formed with a second dopant, and the diffusivity of the second dopant into silicon is greater than the diffusivity of the first dopant into silicon.

In another embodiment of the present invention, a semiconductor device is provided. The semiconductor device includes an insulating layer and a silicon semiconductor layer over the insulating layer. The silicon layer includes a first portion and a second portion, and a thickness of the second portion is greater than a thickness of the first portion.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention improves performance, reduces floating body effects, and allows for separate optimization of separate transistors formed on an SOI structure. This is achieved, in part, by providing a semiconductor device having different portions, with each portion having a silicon semiconductor layer of the SOI structure, and a thickness of one portion of the silicon layer differing from another portion of the silicon layer. In so doing, the thickness of each portion of the silicon layer can be optimized depending upon factors, such as whether a transistor formed on the SOI structure is to be partially or fully depleted and the diffusion characteristics of the dopants used to form the transistors.

Embodiments of the present invention are illustrated in FIGS. 1–5. FIGS. 1A and 2A illustrate a conventional SOI structure. The SOI structure includes a silicon semiconductor layer 14 above an insulator layer 12. The SOI structure is then positioned over a substrate 10. The invention is not limited as to the manner in which the SOI structure is formed. For example, one method of forming an SOI structure involves implanting heavy doses of oxygen into the substrate 10. The substrate 10 is then subjected to an annealing process, which forms a silicon oxide insulator layer 12 and the silicon layer 14 above the insulator layer 12. Another method of forming an SOI structure includes a technique termed wafer bonding in which the SOI structure is bonded onto a substrate 10. The substrate 10 can be formed from any material suitable for use with an SOI structure, for example, metal substrates have been contemplated. However, in one aspect, the substrate 10 is formed from silicon.

The insulator layer 12 can be formed from any material suitable for use with an SOI structure. For example, sapphire and $Si_3N_4$ are materials known to be acceptable for use with an SOI structure. However, in certain aspects, the insulator layer 12 is formed from $SiO_2$. Although not limited in this manner, the insulator layer 12 can have a thickness from about 100 to 500 nanometers.

The silicon layer 14 is formed above the insulator layer 12, and the silicon layer 14 is not limited as to a particular thickness. However, in a current aspect of the present invention, the thickness of the silicon layer 14 can be optimized for particular individual devices formed on the wafer. In this manner, a semiconductor device can be provided with different portions, each portion having a silicon layer 14 with a thickness that differs from another portion. The invention is also not limited in the manner in which the thickness of the silicon layer 14 of each portion is modified. Two exemplary methods of modifying the thickness of the silicon layer 14 are respectively illustrated in FIGS. 1A–D and 2A–D.

Figure 1A:
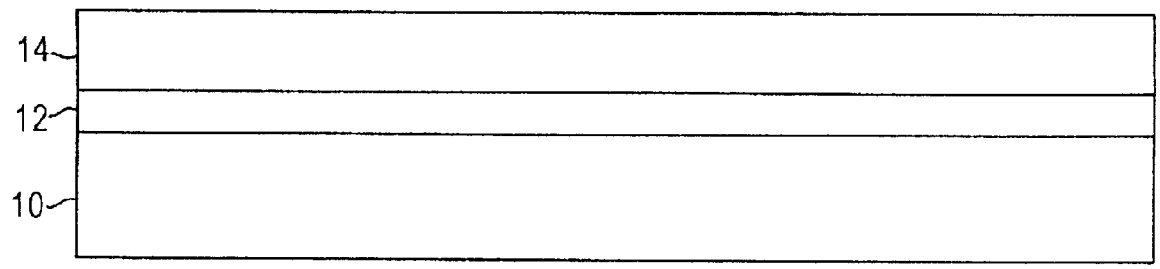
FIGS. 1A–1D schematically illustrate sequential phases of a SOI fabrication method according to one embodiment of the present invention.
Figure 1B:
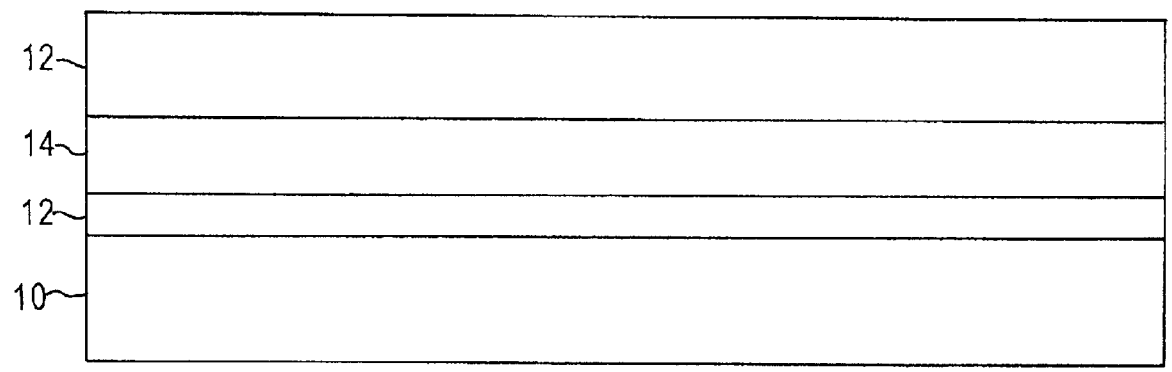
Figure 1C:
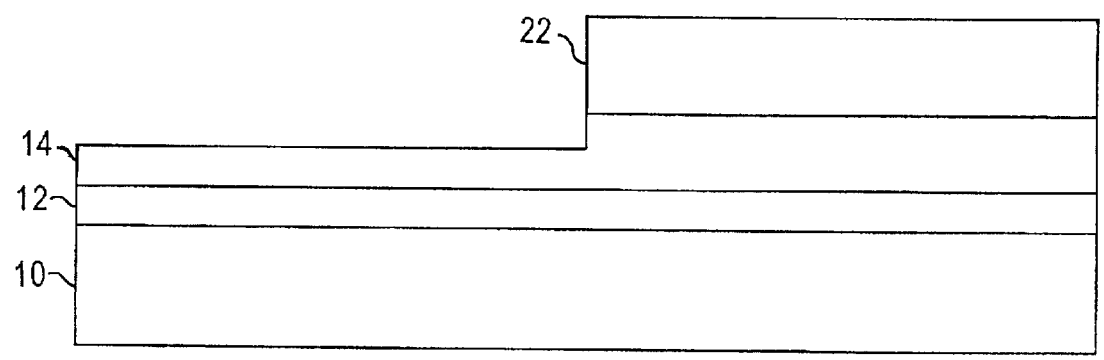

In FIG. 1B, a photoresist 22 is formed over the silicon layer 14, and in FIG. 1C, the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the silicon layer 14, which will thereby define the portions of the silicon layer 14 having a modified thickness. An etch, typically anisotropic, although not limited in this manner, is then applied to remove a certain thickness of the exposed portions of the silicon layer 14.

Figure 1D:
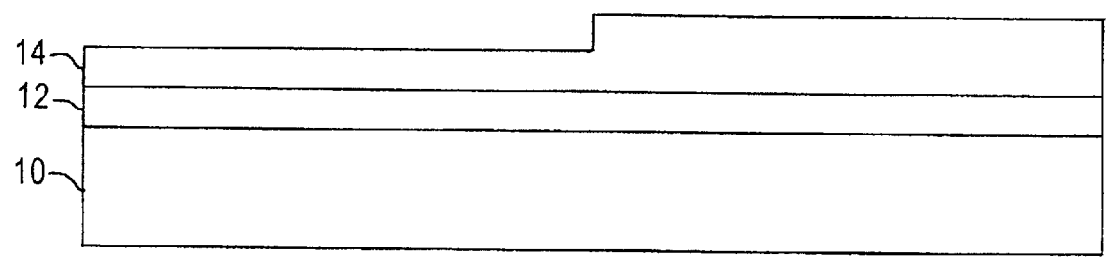
Figure 3:
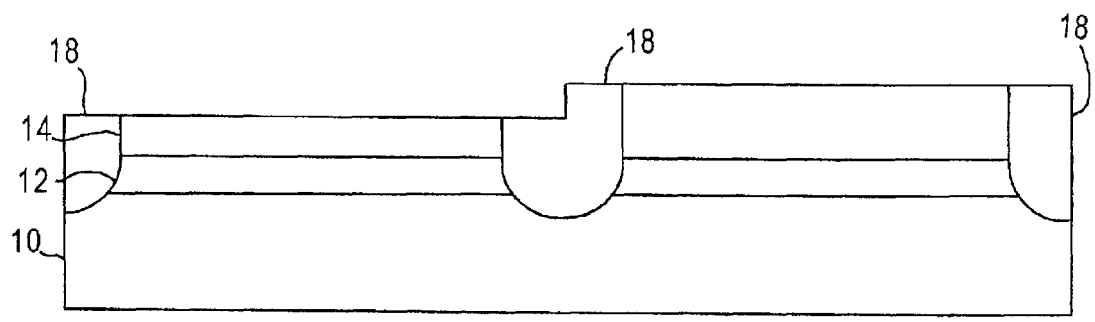
FIG. 3 schematically illustrates a SOI semiconductor device having different portions with silicon layers having different thicknesses.

In FIG. 1D, the remaining photoresist 22 is removed, and a semiconductor device precursor having different portions with a silicon layer 14 of different respective thicknesses is provided. Once the photoresist 22 is removed, as shown in FIG. 3, isolation features 18 can be provided in the silicon layer 14. The invention, however, is not limited in the manner in which the isolation features 18 are formed. For example, a shallow isolation trench can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 2A:
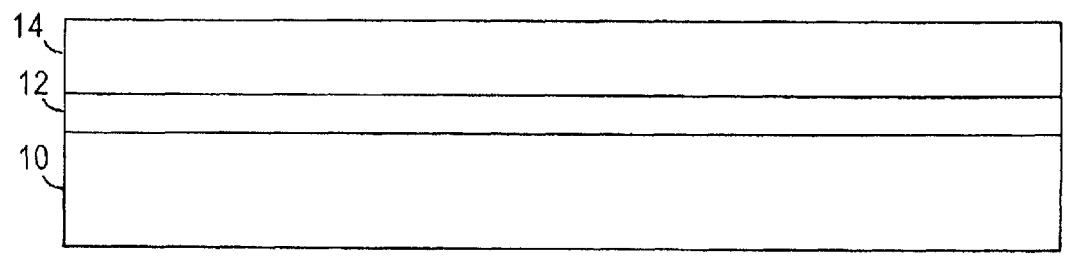
FIGS. 2A–2D schematically illustrate sequential phases of a SOI fabrication method according to another embodiment of the present invention.
Figure 2B:
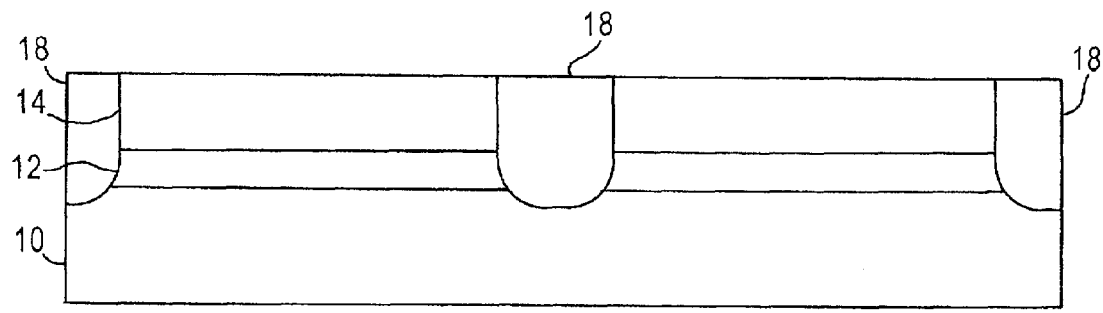

Alternatively, as illustrated in FIGS. 2A–2D, the isolation features 18 can be formed before the thickness of certain portions of the silicon layer 14 are modified. Furthermore, as also illustrated in FIGS. 2A–2D, a hard mask can be formed over the silicon layer 14 to aid in etching of the silicon layer 14. As illustrated in FIG. 2B, the isolation features 18 are formed in the silicon layer 14, and as described above, the invention is not limited in the manner in which the isolation features 18 are formed.

Figure 2C:
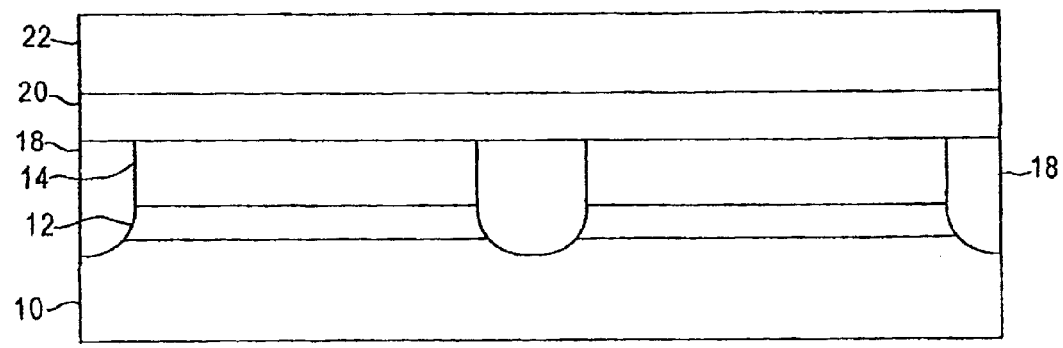

In FIG. 2C, a mask layer 20 is formed over the silicon layer 14, and the invention is not limited as to a particular mask layer 20. For example, the mask layer 20 can be formed from an anti-reflective film, which can be advantageously used during fine line patterning. In a current aspect, the mask layer 20 is formed from silicon nitride.

Figure 2D:
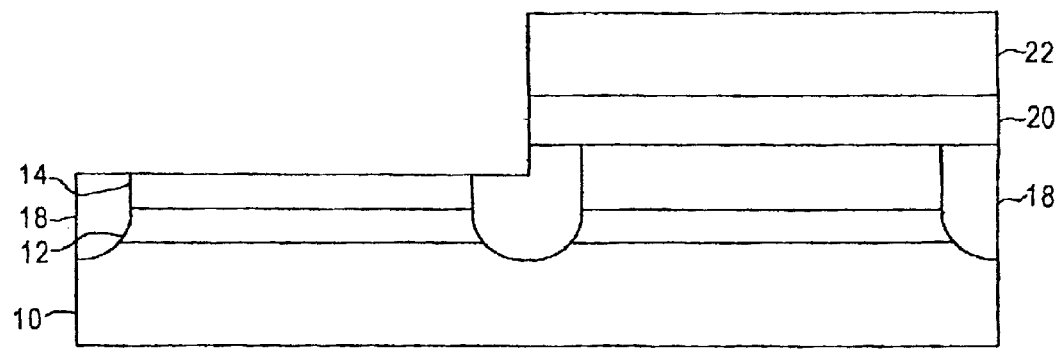

Upon formation of the mask layer 20, a photoresist 22 is formed over the mask layer 20. In FIG. 2D, the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the mask layer 20. A portion of the exposed mask layer 20 below the openings in the photoresist 22 is then removed, which exposes portions of the silicon layer 14 to be modified.

After portions of the mask layer 20 have been removed, the exposed portions of the silicon layer 14 are partially removed, and the invention is not limited in the manner in which the exposed portions of the silicon layer 14 are partially removed. For example, the exposed portions of the silicon layer 14 can be partially removed using an etch, such as an anisotropic etch. The amount of the exposed portions of the silicon layer 14 being removed can be determined, for example, by subjecting the exposed portions of the silicon layer 14 to the etch for a given time, as the removal rate of silicon for a given etchant is known. Another example of partially removing exposed portions of the silicon layer 14 involves oxidizing the exposed portions of the silicon layer 14 to form silicon oxide. The silicon oxide can then be removed leaving only the silicon layer 14. An advantage of using this process is that the consumption of silicon to form silicon oxide can be very closely controlled, and this allows for precise control of the partial removal of the exposed portions of the silicon layer 14.

Figure 4:
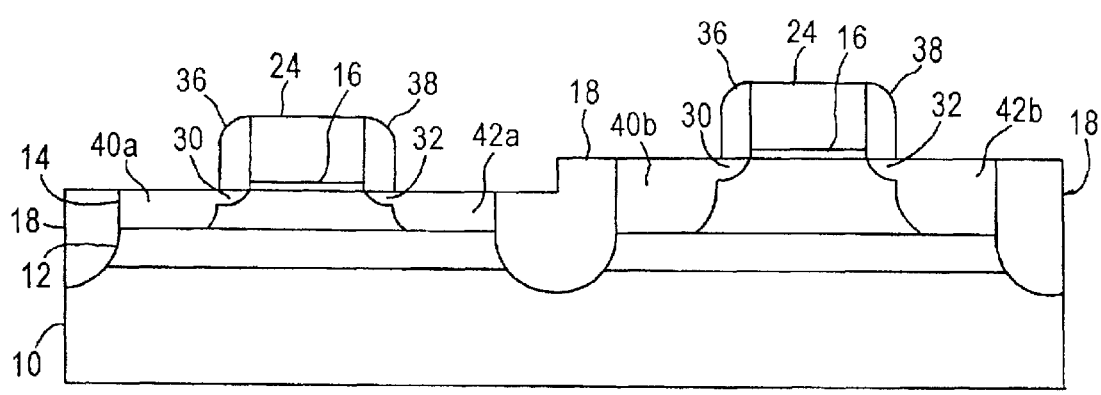
FIG. 4 illustrates the semiconductor device of FIG. 3 after features are formed on the silicon layers having different thicknesses.

As illustrated in FIG. 3, after the remaining mask layer 20 and photoresist 22 is removed using techniques known to those skilled in the art, a semiconductor device having different portions, with each portion having a silicon layer 14 with a thickness that differs from another portion, is provided. Once the thickness of certain portions of the silicon layer 14 has been modified, features, such as transistors although not limited in this manner, can be formed in the silicon layer 14, as illustrated in FIG. 4.

The features, for example, can include a gate dielectric 16 and a gate electrode 24 over the gate dielectric 16. Sidewall spacers 36, 38 can be formed on sidewalls 26, 28 of the gate electrode 24, and source/drain extensions 30, 32 can be formed in the silicon layer 14 underneath the sidewall spacers 36, 38. Furthermore, source/drain regions 40, 42 can be formed in the silicon layer 14. As shown, the source/drain regions 40a, 42a in a first portion of the semiconductor device can have different depths than the source/drain regions 40b, 42b in a second portion of the semiconductor device.

Figure 5:
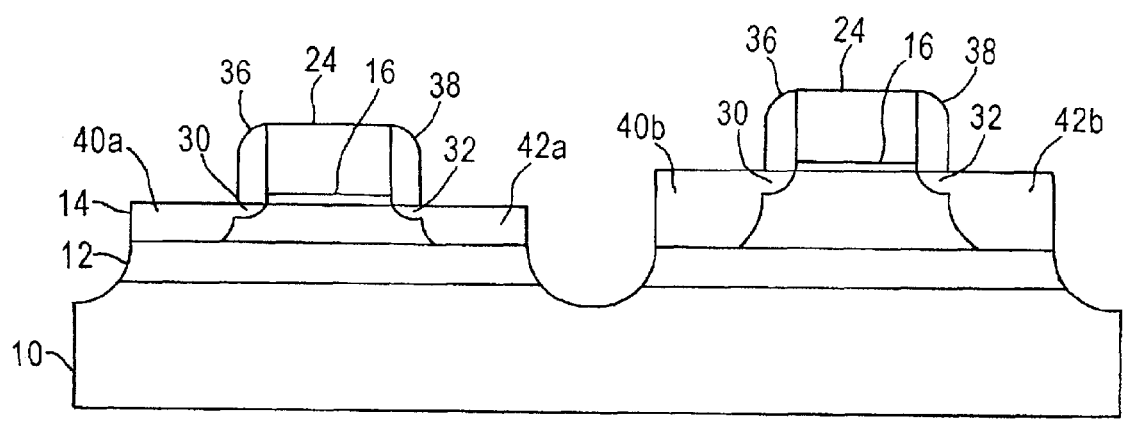
FIG. 5 schematically illustrates a SOI semiconductor device in which the isolating regions are removed.

In FIG. 5, the isolation features 18 can be removed, and the invention is not limited as to the manner in which the isolation features 18 are removed. For example, the isolation features 18 can be removed using an etchant having a high selectivity to the material with which the isolation features 18 are formed. By removing the isolation features 18, the silicon layer 14 between the isolation features 18 can be relaxed. During formation of the isolation features 18, the silicon layer 14 is stressed, and this stressing of the silicon layer 14 can degrade transistor performance. Furthermore, it is noted that the removal of the relaxing of the silicon layer 14, for example by removing the isolation features between adjacent silicon layers 14, is not limited to semiconductor devices having portions with different depths. For example, the relaxing of the silicon layer 14 can occur for semiconductor devices having a silicon layer 14 with a single depth.

By providing a semiconductor device having different portions, with each portion having a silicon layer with a thickness that differs from another portion, the formation of NMOS and PMOS transistors can be optimized. For example, a transistor with a dopant (e.g., boron) that has a greater diffusion rate in silicon can be formed on a portion of the silicon layer having a greater thickness than a portion of the silicon layer upon which another transistor, with a dopant (e.g., arsenic) with a lower diffusion rate, is formed. Thus, the NMOS and PMOS transistors can both be exposed to an optimal temperature/time profile.

Another advantage of providing a semiconductor device having different portions, with each portion having a silicon layer with a thickness that differs from another portion, is that both fully and partially depleted transistors can be easily formed. For example, a partially depleted transistor can be formed on a portion of the silicon layer having a greater thickness, and a fully depleted transistor can be formed on a portion of the silicon layer with a lesser thickness. Thus, even if the source/drain regions extend down to the same depth, both partially and fully depleted transistors can be formed. Alternatively, floating body effects can be minimized by eliminating the neutral region between the source/drain region and the insulating layer by making all transistors fully depleted.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:

providing a silicon layer over an insulating layer, the silicon layer including a first portion and a second portion;

partially removing the first portion of the silicon layer, wherein a thickness of the second portion is greater than a thickness of the first portion; and forming a first transistor in the first portion and a second transistor in the second portion, wherein:

the first transistor includes first source/drain regions and the second transistor includes second source/drain regions, and a depth of the second source/drain regions is greater than a depth of the first source/drain regions, the first source/drain regions are formed with a first dopant and the second source/drain regions are formed with a second dopant, and the diffusivity of the second dopant into silicon is greater than the diffusivity of the first dopant into silicon.

2. The method according to claim 1, wherein the first and second portions of the silicon layer initially have the same thickness.

3. The method according to claim 1, wherein the step of partially removing the first portion of the silicon layer includes etching the first portion.

4. The method according to claim 3, wherein the step of partially removing the first portion of the silicon layer includes depositing a resist over the silicon layer and exposing and developing the resist to expose the first portion of the silicon layer.

5. The method according to claim 3, wherein the thickness of the first portion is determined by etching the first portion for a predetermined length of time.

6. The method according to claim 1, wherein the step of partially removing the first portion of the silicon layer includes oxidizing the first portion of the silicon layer and removing the oxidized silicon.

7. The method according to claim 6, wherein the step of partially removing the first portion of the silicon layer includes depositing a mask layer and a resist over the silicon layer and exposing and developing the resist to expose a portion of the mask layer over the first portion of the silicon layer and removing the mask layer over the first portion of the silicon layer.

8. The method according to claim 7, further comprising the step of removing the mask layer.

9. The method according to claim 7, wherein the mask layer is an antireflective material.

10. The method according to claim 7, wherein the mask layer is silicon nitride.

11. The method according to claim 1, wherein the first portion of the silicon layer is immediately adjacent the second portion, and the first portion and the second portion are separated by an isolating feature.

12. The method according to claim 1, wherein the first transistor is a N-type transistor and the second transistor is a P-type transistor.

13. A semiconductor device, comprising:

an insulating layer;

a silicon layer over the insulating layer, the silicon layer including a first portion and a second portion; and a first transistor is formed in the first portion and a second transistor is formed in the second portion, wherein a thickness of the second portion is greater than a thickness of the first portion, the first transistor includes first source/drain regions and the second transistor includes second source/drain regions, a depth of the second source/drain regions greater than a depth of the first source/drain regions, the first source/drain regions are formed with a first dopant and the second source/drain regions are formed with a second dopant, and the diffusivity of the second dopant into silicon is greater than the diffusivity of the first dopant into silicon.

14. The method according to claim 13, wherein the first portion of the silicon layer is immediately adjacent the second portion, and the first portion and the second portion are separated by an isolating feature.

15. The semiconductor device according to claim 13, wherein the first transistor is a N-type and the second transistor is a P-type transistor.

* * * * *